(12) United States Patent
Christmann et al.

(10) Patent No.: US 8,440,028 B2
(45) Date of Patent: May 14, 2013

(54) DOMESTIC APPLIANCE WITH A SELF-DIAGNOSING DOOR LOCK POSITION DETECTION DEVICE

(75) Inventors: Jens Christmann, Heidenheim (DE); Peter Schweier, Forheim (DE)

(73) Assignee: BSH Bosch und Siemens Hausgeraete GmbH, Munich (DE)

( * ) Notice: Subject to any disclaimer, the term of this patent is extended or adjusted under 35 U.S.C. 154(b) by 686 days.

(21) Appl. No.: 12/667,698

(22) PCT Filed: Jul. 2, 2008

(86) PCT No.: PCT/EP2008/058533
§ 371 (c)(1),
(2), (4) Date: Jan. 14, 2010

(87) PCT Pub. No.: WO2009/007290
PCT Pub. Date: Jan. 15, 2009

(65) Prior Publication Data
US 2010/0192994 A1    Aug. 5, 2010

(30) Foreign Application Priority Data
Jul. 9, 2007   (DE) .................... 10 2007 031 886

(51) Int. Cl.
*B08B 3/00*    (2006.01)
(52) U.S. Cl.
USPC ............... 134/58 DL; 134/56 D; 134/57 D; 134/57 DL; 134/58 D
(58) Field of Classification Search ............. 134/56 D, 134/57 D, 57 DL, 58, 58 DL, 58 D
See application file for complete search history.

(56) References Cited

U.S. PATENT DOCUMENTS

| | | | |
|---|---|---|---|
| 4,114,194 A | 9/1978 | Walter | |
| 6,759,844 B2 * | 7/2004 | Kliemannel | ............. 324/251 |
| 2002/0113701 A1 | 8/2002 | Turk | |
| 2002/0186010 A1 | 12/2002 | Kliemannel | |
| 2008/0106105 A1 | 5/2008 | Spiessl | |

FOREIGN PATENT DOCUMENTS

| | | |
|---|---|---|
| CN | 1448578 A | 10/2003 |
| DE | 2756547 A1 | 6/1979 |
| DE | 2938659 A1 | 4/1980 |
| DE | 3539199 A1 | 5/1987 |
| DE | 19521293 A1 | 12/1995 |
| DE | 102005017870 A1 | 11/2005 |
| DE | 102006036551 A1 | 2/2008 |
| EP | 1498796 A1 | 1/2005 |
| GB | 2133455 A | 7/1984 |
| GB | 2407126 A | 4/2005 |
| JP | 11290260 A * | 10/1999 |
| JP | 2003284896 A * | 10/2003 |

OTHER PUBLICATIONS

Report of Examination CN 200880023928.4.

* cited by examiner

*Primary Examiner* — Michael Barr
*Assistant Examiner* — Charles W Kling
(74) *Attorney, Agent, or Firm* — James E. Howard; Andre Pallapies

(57) ABSTRACT

A domestic appliance having a door and a door position detector. The door position detector detects an open or closed position of the door and provides a respective signal when the door is in the open or closed position. A monitoring circuit may be connected to the door position detector to check the operability of the door position detector.

13 Claims, 2 Drawing Sheets

DOMESTIC APPLIANCE WITH A SELF-DIAGNOSING DOOR LOCK POSITION DETECTION DEVICE

BACKGROUND OF THE INVENTION

Domestic appliances of the generic type are known. It is thus necessary to detect the door lock position for a domestic appliance in order to guarantee safe operation of the domestic appliance. For example the recirculation pump is stopped in a dishwasher if the door is no longer closed. This is designed to avoid burn injuries caused by water being sprayed out.

It is known that the door lock position can be detected using a reed switch. The reed switch comprises magnetizable switching contacts arranged in a protected enclosure which are moved by an external permanent magnet into a closed or an open position. The permanent magnet is arranged on a movable closure part of the door lock. If the door lock is now opened, the reed switch moves out of the effective range of the permanent magnet. This either opens or closes the reed switch, depending on the circuitry, and a change in the circuit is able to be detected by a supervision circuit.

The disadvantage of these types of reed switch is that malfunctions resulting from a short circuit or an interruption will be interpreted and evaluated as normal operating states and thereby not recognized.

The underlying object of the invention is thus to provide a domestic appliance with self-diagnosis capabilities.

The invention is based on a domestic appliance, especially a water-conducting domestic appliance such as a domestic dishwasher for example, having at least one door with which a treatment area of the domestic appliance can be opened or closed. Furthermore door position detection means are provided for detecting an open or closed door position.

BRIEF SUMMARY OF THE INVENTION

The object of the invention is achieved by the door position detection means, for an open and a closed door position, providing a signal corresponding to the door position, especially a signal deviating from zero. Thus a signal is available for each position of the door, the presence of which indicates that the door position detection means is operable.

Preferably there is provision in this case for the door position detection means to provide signals inverted in relation to each other for the open and closed door position. This allows an especially simple signal processing for checking the operability by inverting one of the two signals as well as subsequent monitoring for deviations.

In addition there is preferably provision for the door position detection means to be linked to a monitoring circuit for function monitoring, so that the operability of the door position detection means can also be checked permanently or at intervals and a self-diagnosis capability is provided overall.

In such cases the door position detection means can involve a light barrier for which different colors are assigned to different door positions for example, so that the current door position can be detected on the basis of the color. In addition UV or IR radiation can be used as well as visible light.

In a further alternate embodiment there is provision for the door position detection means to be embodied for capacitive detection, with differing door positions being assigned different capacitance values.

In a further alternate embodiment there is provision however for the door position detection means to be embodied for inductive detection. Similarly different door positions are assigned different inductances.

Preferably in this case there is provision for the door position detection means to feature a least one permanent magnet and a magnetic switch so that the apparatus has a simple layout.

There is also preferably provision for the magnetic switch to be a Hall sensor. This allows use to be made of the fact that, for a known input signal of a Hall sensor, an inverted signal of the input signal is present at its output. The output signal to be expected can thus be deduced for a known input signal. If this expected output signal does not arrive, either the door lock to be monitored is open or there is a general circuit fault. This enables an additional safety function to be integrated in a simple manner.

In such cases there is preferably provision for the door to be able to be latched by means of a closure device in at least one door position, for example in the door position in which the door is closing off a treatment area of a domestic appliance. To this end, in the case of a domestic dishwasher for example, a so-called quick-release lock can be used with which it is only necessary to exert a minimum force to open the door but no key or the like is required. In this case the closure device guarantees that the door also remains closed during the operation of the domestic appliance and it is not subjected to pressure by the internal pressure obtaining in the treatment area which is built up for example by the heating up of the air in the treatment area.

In this case there is preferably provision for the door position detection means to be a door lock position detection device. Therefore the position of a door lock striker of a lock is detected, rather than the position of the door. This allows an especially compact layout in which both the permanent magnet and also the Hall sensor are integrated into a door lock position detection device. Furthermore the permanent magnet and also the Hall sensor can be arranged on the door or the housing of the domestic appliance.

There is also preferably provision for the Hall sensor to be able to be brought into the effective range of the permanent magnet by moving the door, especially by closing it.

In a preferred embodiment there is provision for the monitoring circuit to create a defined signal that is supplied to the Hall sensor and for output signals of the Hall sensor to be checked for plausibility.

For this purpose the monitoring circuit preferably comprises a comparison circuit that compares output signals of the hall sensor with a required signal of the Hall sensor so that, if there is a deviation from an inverted input signal of the Hall sensor, it can be concluded that the device is operating incorrectly.

In this case there is preferably provision for a signal to be generated if output signals of the Hall sensor deviate from the required signal. This signal can be further processed in a controller of the domestic appliance and can trigger different safety measures, for example switching off pumps such as the recirculation pump if the door is not closed. This can involve an optical and/or acoustic alarm signal.

In a preferred embodiment of the invention there is provision for the defined signal present at the input of the Hall sensor to be a pulse signal, with a fixed clock frequency for example. This allows the inverted signal of the output of the Hall sensor to be calibrated in an especially simple manner by simply reversing this pulsed signal.

In this case there is preferably provision for the defined signal to be a square-wave signal. Furthermore there is preferably provision for the domestic appliance to be a dishwasher.

Finally a door lock position detection device for a domestic appliance belongs to the invention.

BRIEF DESCRIPTION OF THE DRAWINGS

The invention will be explained in greater detail below in an exemplary embodiment which refers to the associated drawings. The figures show.

DETAILED DESCRIPTION OF EXEMPLARY EMBODIMENTS OF THE PRESENT INVENTION

Figure 1:
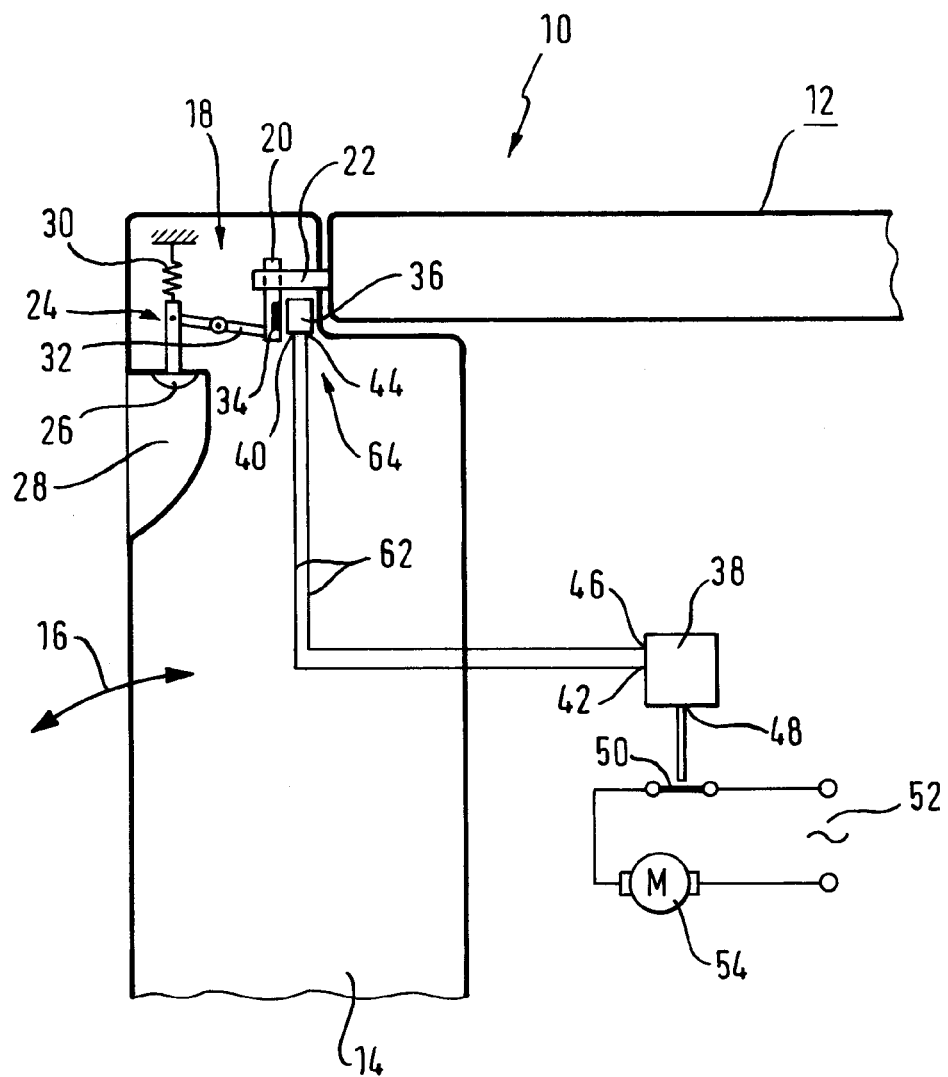
FIG. 1 a schematic view of an inventive circuit arrangement for monitoring the position of a door lock, and FIG. 2 a circuit diagram of the circuit arrangement.

FIG. 1 shows a schematic diagram of a section of a dishwasher 10. The dishwasher 10 possesses a housing 12 which is able to be closed off by a door 14. The door 14 is hinged on the housing 12 such that it is able to be opened or closed respectively in the directions indicated by the double-headed arrow 16. The layout and method of operation of dishwasher 10 are generally known so that these will not be discussed in any greater detail within the context of this description.

The door 14 is able to be latched on the housing 12 by means of a closure device 18. The closure device 18 comprises a door lock striker 20 which is able to be engaged with a latch 22. The latch 22 is arranged on the housing 12 and engages in a corresponding opening (not shown) of the door 14. The door lock striker 20 is able to be moved by means of an actuation device 24. The actuation device 24 comprises a button element 26 which is able to be reached via a recessed handle 28 within the door 14. The button element 26 is able to be displaced against the force of a spring element 30, so that the door lock striker 20 is able to be disengaged from the latch 22 via a rotatably supported cantilever 32 or is able to be engaged automatically with the latch 22 by the force of the spring element 30 when the door 14 is pushed closed. The schematic layout of the closure device 18 shown here merely serves as an example. Any other suitable embodiment is possible.

Furthermore a door closure detection device 64 is provided comprising at least one permanent magnet 34 and a Hall sensor serving as a magnetic switch 36. In this case the permanent magnet 34 is arranged on the door 14 while the Hall sensor 36 is attached to a fixed location on the housing 12.

When the closure device 18 is opened the door lock striker 20 experiences a movement. The permanent magnet 34 is arranged on the door lock striker 20, the effective range of which is located with a closed door 14 within the detection range of the Hall sensor 36. The Hall sensor 36 is connected to a monitoring circuit 38. In this case an input 40 of the Hall sensor 36 is connected via connecting lines 62 to an output 42 of the monitoring circuit and an output 44 of the Hall sensor 36 is connected to an input 46 of the monitoring circuit 38. A switching output of the monitoring circuit 50 is connected to a switching element 50 of a power supply circuit 52 for a recirculating pump motor 54 of the dishwasher 10.

The circuit arrangement depicted in FIG. 1 shows the following function:

While the dishwasher 10 is being used according to specification the door 14 is closed. This means that the door lock striker 20 engages in the latch 22 so that the permanent magnet 34 assumes a defined position in relation to the Hall sensor 36. If the actuation device 24 is now inadvertently actuated during the operation of the dishwasher 10, the position of the permanent magnet 34 changes in relation to the Hall sensor 36. An associated change in the Hall voltage of the Hall sensor 36 is detected by the monitoring circuit 38 and a switch-off signal is generated for the recirculating pump motor 54. This is done by activating the circuit breaker 50.

The monitoring circuit 38 simultaneously contains a self-supervision of the Hall sensor 36. To this end there is a defined signal at the output 42 of the monitoring circuit 38 with which the Hall sensor is supplied via its input 40. An inverted signal of this input signal which is supplied via input 46 of the monitoring circuit 38 is then present at output 44. The monitoring circuit 38 can use a comparator circuit 56 to compare the actual input signal at the monitoring circuit 38 with the expected required input signal. If the signals differ there is either a malfunction of the Hall sensor 36 or an interruption or a short circuit respectively in the connecting lines 62 between monitoring circuit 38 and Hall sensor 36.

Figure 2:
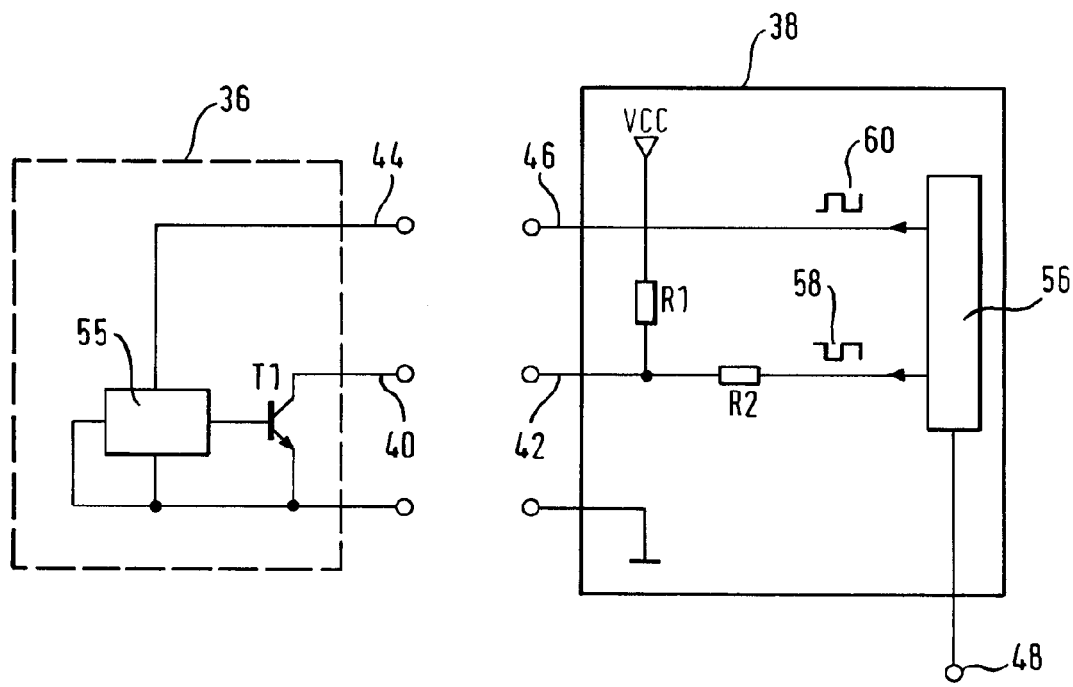

The comparator circuit 56 will be explained with reference to FIG. 2. On the one hand the comparator circuit 56 generates the output signal 58 present at the output 42 of the monitoring circuit 38 and on the other hand it receives the input signal 60 present at the input 46 of the monitoring circuit 38. The output signal 58 is fed via a voltage divider of resistors R1 and R2 to the output 42 and is thus present at the input 40 of the Hall sensor 36. This output signal 58 is fed via an input transistor T1, the collector of which is connected to the input 40, to the sensitive chip 55 of the Hall sensor 36.

The inverted input signal is then present at the output 44 of the Hall sensor 36 which is supplied via the input 46 of the monitoring circuit 38 as a signal to the comparison circuit 56.

In the example shown the output signal 58 of the monitoring circuit 38 is a square-wave signal with a predetermined clock frequency. The signal 60 is then—if the system is operating correctly—exactly the inverted signal of signal 58. This means that when the signal 58 has the level LOW, the signal 60 has the level HIGH, and when the signal 58 has the level HIGH, the signal 60 has the level LOW.

The signal 60 can now be evaluated via the comparator circuit 56 according to the signal 58 as to whether this actual signal 60 corresponds to the expected required signal. If the result of this comparison is a deviation between the expected signal and the actual signal 60, the alarm signal for interrupting the power supply circuit 52 (FIG. 1) will be generated via the comparator circuit 56 at the output 48 of the monitoring circuit 38.

| List of reference signs | |
|---|---|
| 10 | Dishwasher |
| 12 | Housing |
| 14 | Door |
| 16 | Opening or closing of the door |
| 18 | Closing device |
| 20 | Door lock striker |
| 22 | Latch |
| 24 | Actuation device |
| 26 | Button element/button |
| 28 | Recessed handle |
| 30 | Spring element |
| 32 | Cantilever |
| 34 | Permanent magnet |
| 36 | Hall sensor |
| 38 | Monitoring circuit |
| 40 | Input of the Hall sensor |
| 42 | Output of the monitoring circuit |
| 44 | Output of the Hall sensor |
| 46 | Input of the monitoring circuit |
| 48 | Switch output |
| 50 | Switching element |
| 52 | Power supply circuit |
| 54 | Recirculating pump motor |
| 55 | Sensitive chip |

| List of reference signs | |
|---|---|
| 56 | Comparator circuit |
| 58 | Output signal |
| 60 | Input signal |
| 62 | Connecting lines |
| 64 | Door lock position detection device |

The invention claimed is:

1. A domestic appliance, comprising:
a door;
a door position detector including a Hall sensor to detect one of an open position of the door and a closed position of the door, and to provide respective signals when the door is in the one of the open position of the door and in the closed position of the door; and
a monitoring circuit connected to the door position detector, and comprising a comparator circuit to compare output signals of the Hall sensor to an expected signal of the Hall sensor to check the operability of the door position detector.

2. The domestic appliance of claim 1, wherein the domestic appliance is a water-conducting domestic appliance.

3. The domestic appliance of claim 1, wherein the respective signals deviate from zero.

4. The domestic appliance of claim 1, wherein one of the respective signals provided by the door position detector that corresponds to the open position of the door is inverted to the another of the respective signals provided by the door position detector that corresponds to the closed position of the door.

5. The domestic appliance of claim 1, wherein the door position detector has a permanent magnet and a magnetic switch.

6. The domestic appliance of claim 5, wherein the permanent magnet has a predetermined effective range, and wherein, by moving the door, the Hall sensor is moved into the predetermined effective range of the permanent magnet.

7. The domestic appliance of claim 1, further comprising a closure device to lock the door in at least one door position.

8. The domestic appliance of claim 1, wherein the door position detector is a door lock position detector.

9. The domestic appliance of claim 1, wherein the monitoring circuit generates a predetermined signal which is supplied to the Hall sensor, and wherein output signals of the Hall sensor are checked for plausibility.

10. The domestic appliance of claim 9, wherein the predetermined signal is a pulse signal.

11. The domestic appliance of claim 9, wherein the predetermined signal is a square-wave signal.

12. The domestic appliance of claim 1, wherein the comparator circuit generates a signal if the output signals of the Hall sensor deviate from the expected signal of the Hall signal.

13. The domestic appliance of claim 1, wherein the domestic appliance is a dishwasher.

\* \* \* \* \*

UNITED STATES PATENT AND TRADEMARK OFFICE
CERTIFICATE OF CORRECTION

PATENT NO. : 8,440,028 B2  
APPLICATION NO. : 12/667698  
DATED : May 14, 2013  
INVENTOR(S) : Christmann et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 689 days.

Signed and Sealed this
Eighth Day of September, 2015

Michelle K. Lee  
*Director of the United States Patent and Trademark Office*